(12) United States Patent
Yoshida et al.

(10) Patent No.: US 9,640,500 B2
(45) Date of Patent: May 2, 2017

(54) TERMINAL STRUCTURE AND SEMICONDUCTOR DEVICE (71) Applicant: TDK CORPORATION, Tokyo (JP)

(72) Inventors: Kenichi Yoshida, Tokyo (JP); Makoto Orikasa, Tokyo (JP); Hideyuki Seike, Tokyo (JP); Yuhei Horikawa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 13 days.

(21) Appl. No.: 13/960,173

(22) Filed: Aug. 6, 2013

(65) Prior Publication Data

US 2014/0054767 A1 Feb. 27, 2014

(30) Foreign Application Priority Data

Aug. 24, 2012 (JP) .................................. 2012-185043
Apr. 23, 2013 (JP) .................................. 2013-090419

(51) Int. Cl.
H01L 23/00 (2006.01)

(52) U.S. Cl.
CPC .............. *H01L 24/13* (2013.01); *H01L 24/03* (2013.01); *H01L 24/05* (2013.01); *H01L 24/11* (2013.01);
(Continued)

(58) Field of Classification Search
CPC ......... H01L 24/13; H01L 24/03; H01L 24/05; H01L 24/11; H01L 2224/0401;
(Continued)

(56) References Cited

U.S. PATENT DOCUMENTS 4,205,099 A    5/1980  Jones et al.
5,757,078 A    5/1998  Matsuda et al.
(Continued)

FOREIGN PATENT DOCUMENTS

EP    2 629 323 A1    8/2013
JP    H05-129647 A    5/1993
(Continued)

OTHER PUBLICATIONS

U.S. Appl. No. 13/960,291 in the name of Kenichi Yoshida et al., filed Aug. 6, 2013.
(Continued)

*Primary Examiner* — Joshua King
*Assistant Examiner* — Mohammed R Alam
(74) *Attorney, Agent, or Firm* — Oliff PLC (57) ABSTRACT

The present invention relates to a terminal structure comprising; a base material 10; an external electrode 20 formed on the base material; an insulating coating layer 30 formed on the base material and on the electrode and having an opening exposing at least part of the electrode; an under-bump metal layer 70 filling the opening and covering part of the insulating coating layer; and a dome-shaped bump 85 covering the under-bump metal layer, wherein in a cross section along a lamination direction, the under-bump metal layer has a convex shape toward the bump, and the thickness $T_{u0}$ of the under-bump metal layer at a center of the opening is equal to or greater than the thickness $T_{u1}$ of the under-bump metal layer at an end portion of the opening.

9 Claims, 4 Drawing Sheets (52) U.S. Cl.
CPC ............... *H01L 2224/0345* (2013.01); *H01L 2224/0347* (2013.01); *H01L 2224/03462* (2013.01); *H01L 2224/03464* (2013.01); *H01L 2224/0401* (2013.01); *H01L 2224/05022* (2013.01); *H01L 2224/05572* (2013.01); *H01L 2224/05655* (2013.01); *H01L 2224/1147* (2013.01); *H01L 2224/11464* (2013.01); *H01L 2224/11849* (2013.01); *H01L 2224/13005* (2013.01); *H01L 2224/13006* (2013.01); *H01L 2224/13023* (2013.01); *H01L 2224/13111* (2013.01); *H01L 2924/00014* (2013.01)

(58) Field of Classification Search
CPC . H01L 2924/00014; H01L 2224/05022; H01L 2224/03462; H01L 2224/05572; H01L 2224/0347; H01L 2224/13023; H01L 2224/13006; H01L 2224/11849; H01L 2224/13005; H01L 2224/114
See application file for complete search history.

(56) References Cited

U.S. PATENT DOCUMENTS

| | | | |
|---|---|---|---|
| 6,348,399 B1* | 2/2002 | Lin | 438/616 |
| 6,538,323 B1 | 3/2003 | Sakata et al. | |
| 6,969,915 B2 | 11/2005 | Tago et al. | |
| 7,282,432 B2 | 10/2007 | Tago et al. | |
| 7,611,041 B2 | 11/2009 | Tago et al. | |
| 7,793,818 B2 | 9/2010 | Tago et al. | |
| 8,643,180 B2 | 2/2014 | Shinkai et al. | |
| 2002/0185733 A1 | 12/2002 | Chow et al. | |
| 2003/0157792 A1 | 8/2003 | Tong et al. | |
| 2005/0186771 A1 | 8/2005 | Tanida et al. | |
| 2005/0258540 A1* | 11/2005 | Minda | H01L 24/03 257/738 |
| 2007/0155155 A1 | 7/2007 | Tanida et al. | |
| 2007/0249155 A1 | 10/2007 | Chen et al. | |
| 2008/0150134 A1* | 6/2008 | Shinkai et al. | 257/737 |
| 2008/0257595 A1 | 10/2008 | Hu | |
| 2009/0174052 A1 | 7/2009 | Sogawa et al. | |
| 2010/0200271 A1* | 8/2010 | Arvin et al. | 174/126.1 |
| 2010/0213609 A1* | 8/2010 | Kondou et al. | 257/737 |
| 2011/0189848 A1* | 8/2011 | Ewert | C25D 3/32 438/612 |
| 2011/0316119 A1 | 12/2011 | Kim et al. | |
| 2011/0317385 A1 | 12/2011 | Zhou et al. | |
| 2012/0139107 A1 | 6/2012 | Nakano | |

FOREIGN PATENT DOCUMENTS

| | | |
|---|---|---|
| JP | H09-129647 A | 5/1997 |
| JP | A-2001-85456 | 3/2001 |
| JP | A-2002-203868 | 7/2002 |
| JP | 2002-248596 A | 9/2002 |
| JP | A-2002-299366 | 10/2002 |
| JP | 2005-116632 A | 4/2005 |
| JP | A-2006-93290 | 4/2006 |
| JP | 2006-147952 A | 6/2006 |
| JP | 2008-159949 A | 7/2008 |
| JP | 2010-067711 A | 3/2010 |
| JP | 2010-251631 A | 11/2010 |
| JP | 2010267641 A * | 11/2010 |
| JP | 2011-044496 A | 3/2011 |
| KR | 2002-0061528 | 7/2002 |

OTHER PUBLICATIONS

U.S. Appl. No. 13/960,330 in the name of Kenichi Yoshida et al., filed Aug. 6, 2013.
U.S. Appl. No. 13/960,228 in the name of Kenichi Yoshida et al., filed Aug. 6, 2013.
Nov. 18, 2014 Office Action issued in U.S. Appl. No. 13/960,228.
Jan. 9, 2015 Office Action issued in U.S. Appl. No. 13/960,330.
Jul. 2, 2015 Office Action issued in U.S. Appl. No. 13/960,330.

* cited by examiner

TERMINAL STRUCTURE AND SEMICONDUCTOR DEVICE

BACKGROUND OF THE INVENTION

Field of the Invention

The present invention relates to a terminal structure and a semiconductor device.

Related Background Art

For high-density packaging of high performance semiconductors such as central processing unit (CPU), a transition is underway from a wire bonding mounting method as a general-purpose technique to a flip-chip mounting method of forming a bump made of solder or the like on a chip electrode and directly bonding the bump to a substrate.

For example, Patent Literature 1 (Japanese Patent Laid-Open No. 2001-085456) and Patent Literature 2 (Japanese Patent Laid-Open No. 2002-203868) disclose methods of forming bumps on electrodes provided on base materials.

SUMMARY OF THE INVENTION

With the miniaturization of semiconductor devices, it is needed to arrange bumps more closely to each other, that is, bump pitch reduction. Unfortunately, the use of the aforementioned conventional bumps cannot sufficiently meet the need for bump pitch reduction as described below.

Figure 1:
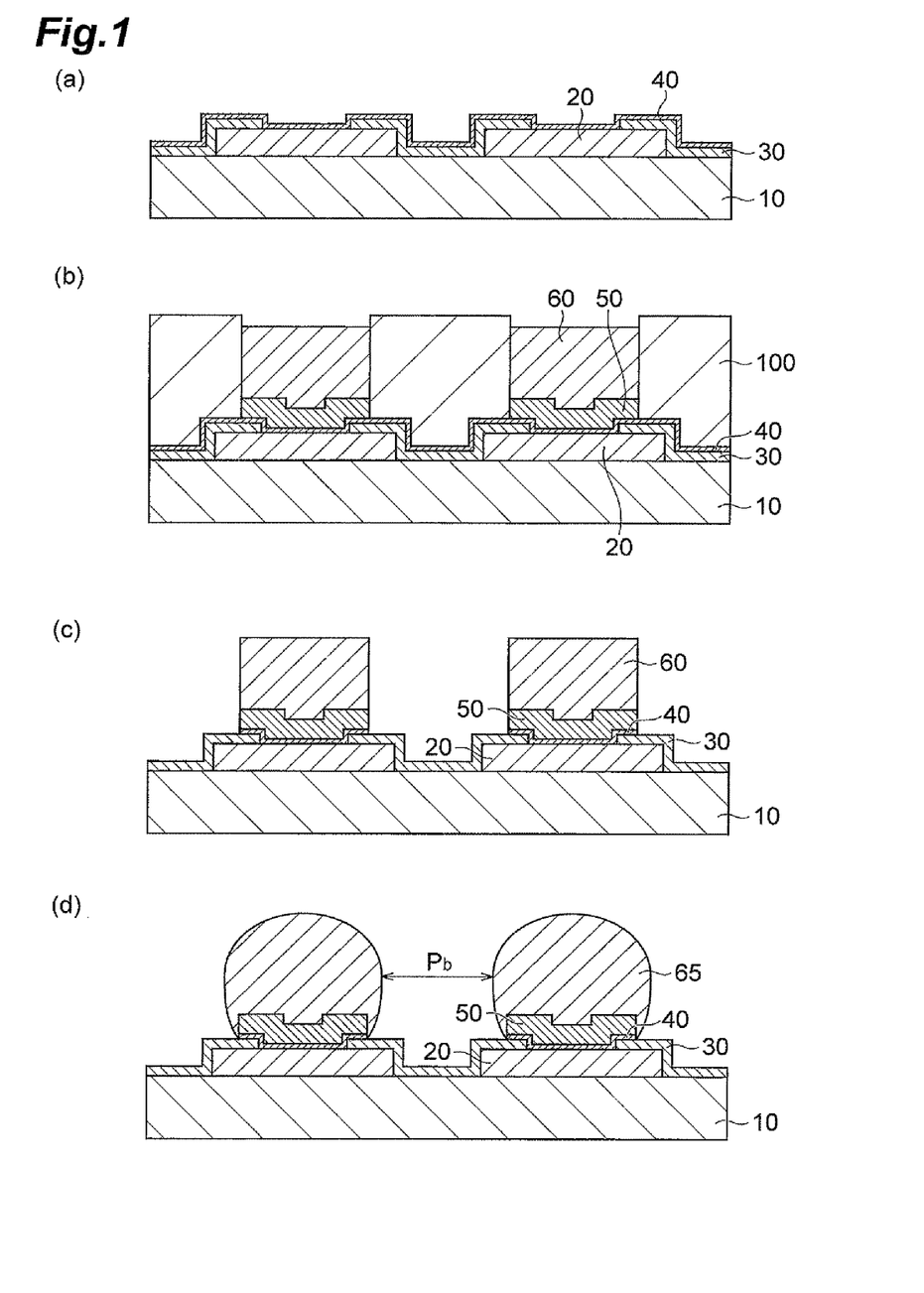
FIGS. 1(a)-(d) are schematic views illustrating a conventional bump forming process.

FIG. 1 is a schematic view illustrating a conventional bump forming process. First, as illustrated in FIG. 1(a), a substrate including an external electrode 20 on a base material 10, a passivation layer (insulating coating layer) 30, and a seed layer 40 are provided. Then, a dry film 100 is formed so as to c over part of the seed layer, and electroplating is performed, which includes electrolytic nickel plating and electrolytic solder plating in this order, to thereby form a under-bump metal layer 50 and a solder plating layer 60 (FIG. 1(b)). Then, the dry film is stripped and an unnecessary seed layer is removed by etching (FIG. 1(c)). Subsequently, the entire substrate is placed in a reflow furnace and heated to thereby form a bump 65 (FIG. 1(d)). In such a terminal structure, the under-bump metal layer has an upper surface having a concave shape toward the external electrode.

Note that when a bump is formed by the above method, an intermetallic compound (IMC) phase (not shown), which is formed near a boundary between the under-bump metal layer and the bump, grows in a direction substantially perpendicular to the boundary while maintaining a concave shape (stepped shape) of the surface of the under-bump metal layer located in a lower layer thereof as is. At this time, growth points of the IMC phase interfere with each other due to the growth in the concave shape. As a result, internal stress partially remains in an interface between the under-bump metal layer and the solder plating layer (bump), which may reduce the mechanical strength on the interface.

In order to address such a reduction in strength, an opening portion of the passivation layer, that is, the concave portion of the under-bump metal layer can be extended to thereby mitigate the effects of interference of growth points in the IMC phase. Unfortunately, this inevitably leads to the need to maintain some degree of inter-bump spacing $P_b$ (see FIG. 1(d)), which limits the potential bump pitch reduction.

In view of the above problems, an object of the present invention is to provide a terminal structure capable of achieving a suitable balance between bump mechanical strength improvement and bump pitch reduction.

The present invention provides a terminal structure comprising: a base material; an electrode formed on the base material; an insulating coating layer formed on the base material and on the electrode and having an opening exposing at least part of the electrode; an under-bump metal layer filling the opening and covering part of the insulating coating layer; and a dome-shaped bump covering the under-bump metal layer, wherein in a cross section along a lamination direction, the under-bump metal layer has a convex shape toward the bump, and a thickness of the under-bump metal layer at a center of the opening is equal to or greater than the thickness of the under-bump metal layer at an end portion of the opening.

Any terminal structure having such a configuration c an suppress growth points from interfering with each other when the IMC phase grows. This makes it possible to sufficiently effectively eliminate a potential internal stress of the conventional terminal structure. Thus, the terminal structure can improve mechanical strength in an interface between the under-bump metal layer and a tin plating layer (bump) more than before. In addition, even if the opening of the insulating coating layer is narrowed, the terminal structure can sufficiently secure the mechanical strength of the same interface and thus can achieve bump pitch reduction.

In addition, it is preferable in the present invention that assuming that on an upper surface of the insulating coating layer on the electrode, point A is defined as a position of an end portion on an opening side of the insulating coating layer and point B is defined as a position of an end portion of the under-bump metal layer; and on a basis of an upper surface of the insulating coating layer on the electrode, point C is defined as a position where the thickness of the under-bump metal layer is half the thickness of the under-bump metal layer at the point A, ratio R between distance AB from the point A to the point B and distance BC from the point B to the point C satisfies the following expression:

$$R = BC/AB \geq 0.05.$$

In other word, this indicates that it is preferable that the thickness of the end portion of the under-bump metal layer on the insulating coating layer is not rapidly decreasing but gradually decreasing. This makes it possible to more suppress the growth points from interfering with each other to thereby grow the tin plating layer, which can further suppress the internal stress from remaining particularly near the end portion of the under-bump metal layer, and for example, can further suppress cracks from occurring in a root portion of the bump. Note that from such a point of view as described above, it is more preferable that particularly a corner of the end portion of the upper surface of the under-bump metal layer is rounded.

Also, in the present invention, the bump preferably contains tin (Sn) as a main component. This causes the bump to have a suitable dome shape, which can more suppress a risk of shorting of bumps with each other even if the bump pitch is reduced. As used herein, "contains tin as a main component" means that the content of tin is 90 mass % or more of the entire constituent component.

Also, in the present invention, the under-bump metal layer preferably contains nickel (Ni) as a main component. This makes it possible to suitably suppress the bump metal from diffusing into the external electrode. As used herein, "contains nickel as a main component" means that the content of nickel is 85 mass % or more of the entire constituent component.

Further, in the present invention, the bump preferably contains titanium (Ti). This makes it possible to suitably suppress the metal contained in the bump from diffusing into the under-bump metal layer.

The present invention provides a semiconductor device having the terminal structure according to the present invention as described above. Any semiconductor device having the terminal structure according to the present invention can meet the need for miniaturization of semiconductor devices.

The present invention can provide a terminal structure capable of achieving a suitable balance between bump mechanical strength improvement and bump pitch reduction.

DESCRIPTION OF THE PREFERRED EMBODIMENTS

There follows a description of preferred embodiments of the present invention, referring to the accompanying drawings as needed. Note that in the following drawings, the same reference numerals are assigned to the same or similar components and the duplicate description is omitted.

[Terminal Structure Forming Process]

Figure 2:
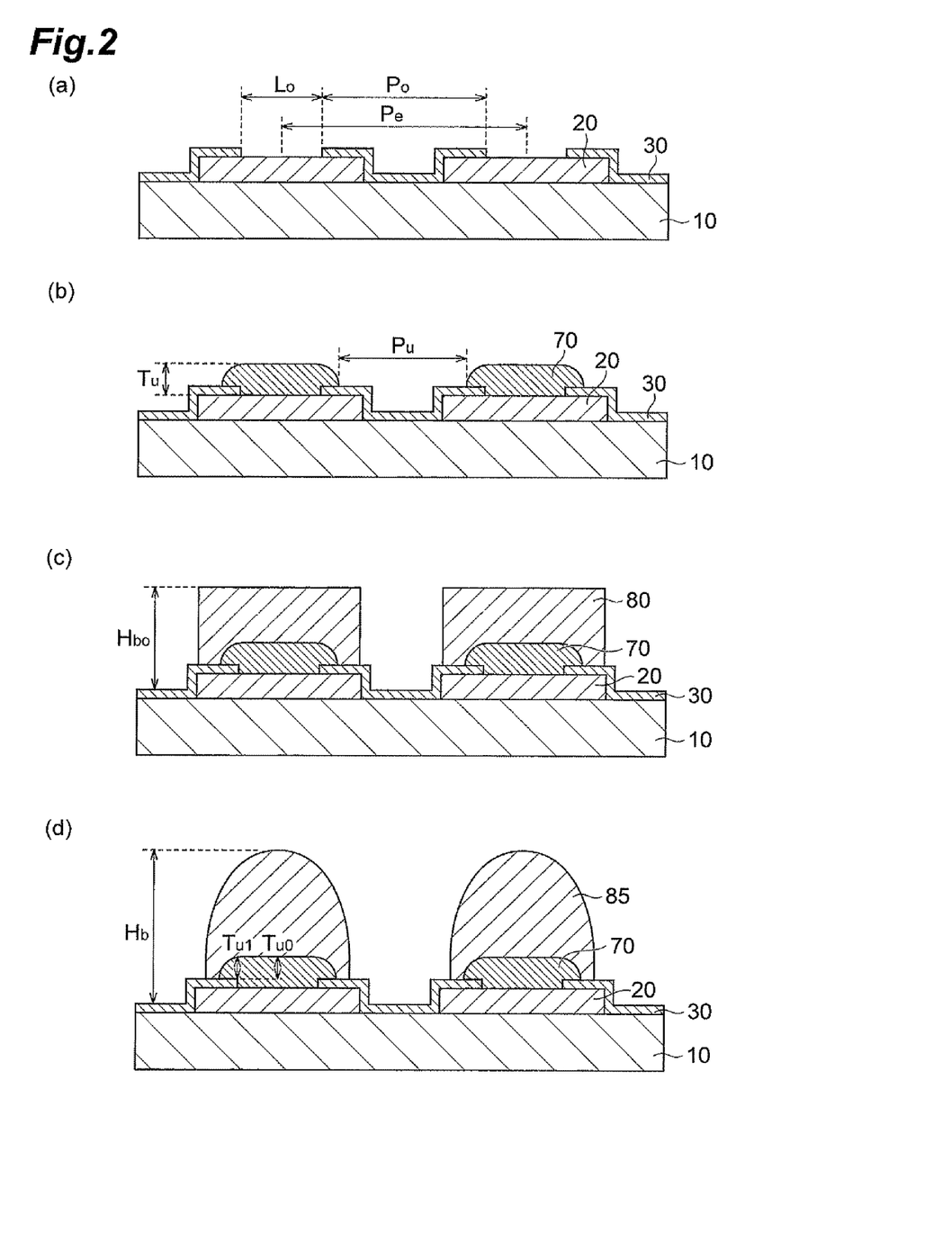
FIGS. 2(a)-(d) are sectional views schematically illustrating a preferred process of forming a terminal structure according to the present embodiment.

FIG. 2 is a sectional view schematically illustrating a preferred process of forming a terminal structure according to the present embodiment. First, as illustrated in FIG. 2(a), a well-known method is used to individually form an external electrode 20 on a base material 10 and an insulating coating layer 30 having an opening on the external electrode. Note that the thickness of the external electrode, pitch $P_e$ (arrangement spacing) of the external electrode, and the thickness of the insulating coating layer are not particularly limited, but are preferable to be 1 to 30 μm, 10 to 150 μm, and 0.1 to 50 μm respectively for more achieving a balance between ease of implementation for forming these layers and bump pitch reduction. Meanwhile, diameter $L_o$ of the opening and spacing $P_o$ of the adjacent openings are preferable to be 3 to 30 μm and 5 to 120 μm respectively from the point of view of improving the electrical connectivity between the external electrode and the bump as well as the electrical insulation between adjacent bumps. Note that examples of the base material include a silicon substrate, an organic substrate, and the like; and examples of the external electrode include an electrode made of Cu, Cu alloy, Al, Al alloy, and the like as the respective preferred aspects thereof. In addition, the insulating coating layer is not particularly limited as long as the layer can protect the base material surface and the external electrode surface from corrosion due to moisture or the like, but examples thereof include a layer made of polyimide, SiN, or the like.

Note that the planar shape (shape of the terminal structure as viewed from above) of the opening in the insulating coating layer 30 is not particularly limited, but may include various shapes such as circular and polygonal shapes. The description of the present embodiment assumes that, though not illustrated, the opening, an under-bump metal layer (UBM layer) 70 and a bump 85 to be described later have a circular planar shape. Note that when the planar shape of the opening is a polygon, the diameter of the opening and the like may be, for example, a maximum length of a line of intersection between a plane of the polygon and a plane perpendicular to the plane of the polygon including a line passing through substantially the center of the polygon.

Then, as illustrated in FIG. 2(b), a well-known pretreatment is performed on the external electrode surface exposed in an opening of the insulating coating layer and then electroless nickel plating is performed to fill the opening thereof to thereby form an UBM layer 70 covering part of the insulating coating layer. Note that, when the external electrode is made of Cu or Cu alloy, examples of the aforementioned pretreatment include degreasing, pickling, and activating treatments. Note also that, when the external electrode is made of Al or Al alloy, examples of the aforementioned pretreatment include degreasing, pickling, and zincate treatments.

From the point of view of preventing the metal contained in the bump from reaching the external electrode due to diffusion or the like, a maximum thickness $T_u$ of the UBM layer is preferable to be 0.5 to 10 μm on the basis of the external electrode surface. Also, from the point of view of providing good electrical insulation between adjacent bumps, a spacing $P_u$ between adjacent UBM layers is preferable to be 4 to 115 μm.

Then, as illustrated in FIG. 2(c), reduction-type electroless tin plating is performed to form a tin plating layer 80 covering the UBM layer and part of the insulating coating layer so as to enclose the entire UBM layer. This makes it possible to obtain a precursor substrate to obtain a desired terminal structure. At this time, from the point of view of obtaining a sufficient amount of bump metal for implementation, a maximum height $H_{b0}$ of the tin plating layer is preferable to be 5 to 40 μm on the basis of the surface of the insulating coating layer on the base material.

Further, the precursor substrate obtained in FIG. 2(c) is subjected to a high-temperature process (reflow) in a nitrogen atmosphere to melt the tin plating layer 80, which is further subjected to rapid cooling to be solidified to thereby form a dome-shaped tin bump 85 (FIG. 2(d)). The reflow conditions are not particularly limited, but preferably the oxygen concentration in the atmosphere is 1000 ppm or less, the temperature is 235 to 300° C., and the holding time is 5 to 120 seconds.

At this time, from the point of view of ensuring sufficient and appropriate contact with a connection terminal for implementation, the maximum height $H_b$ of the tin bump is preferable to be 5 to 50 μm on the basis of the surface of the insulating coating layer on the base material.

Note that on the cross section along a lamination direction, the UBM layer has a convex shape toward the tin bump. As used herein, the expression "the UBM layer has a convex shape toward the tin bump" refers to an appearance of the UBM layer whose upper surface is not even partially recessed toward the external electrode, and the examples of such a UBM layer shape include not only the shape illustrated in FIG. 2(d) but also a dome shape and an arc shape. Also, on the basis of the upper surface of the insulating coating layer on the external electrode, the thickness $T_{u0}$ of the UBM layer in the center of the opening of the insulating coating layer is equal to or greater than the thickness $T_{u1}$ of the UBM layer in the end portion of the opening. From the point of view of suppressing the metal contained in the bump from reaching the external electrode due to diffusion or the like, $T_{u0}$ is preferable to be 0.5 to 10 μm. Also, from the point of view of suppressing the metal contained in the bump from reaching the external electrode due to diffusion or the like from a boundary between the UBM layer and the insulating coating layer, $T_{u1}$ is preferable to be 0.5 to 10 μm in a range not exceeding $T_{u0}$.

In the present embodiment, there is an IMC phase (not shown) mainly containing nickel and tin as constituent elements near a boundary between the UBM layer and the tin bump so as to cover the UBM layer. Note that in the cross section along a lamination direction, the IMC phase is subjected to the aforementioned high-temperature process to thereby grow into a thickness of about 0.1 to 5 μm on the basis of the upper surface of the UBM layer. Specifically, the IMC phase grows in a direction substantially perpendicular to the boundary and in a direction from the UBM layer to the tin bump. At this time, the IMC phase grows starting from a plurality of growth points on the UBM layer. Thus, a plurality of protrusions is formed near a boundary between the UBM layer and the tin bump due to the IMC phase radially growing from the boundary toward the tin bump. Note that since the UBM layer has a convex shape toward the tin bump as described above, the growth points, wherein the IMC phase radially growing in a substantially perpendicular direction from the boundary between the UBM layer and the tin bump, are hard to interfere with each other. As a result, the present embodiment can effectively eliminate the internal stress potentially present near the IMC phase in the conventional terminal structure. Such an IMC phase can be formed by making the UBM layer have a convex shape. Note that the portion near a boundary between the UBM layer and the tin bump may be an IMC layer made of an IMC phase.

Figure 4:
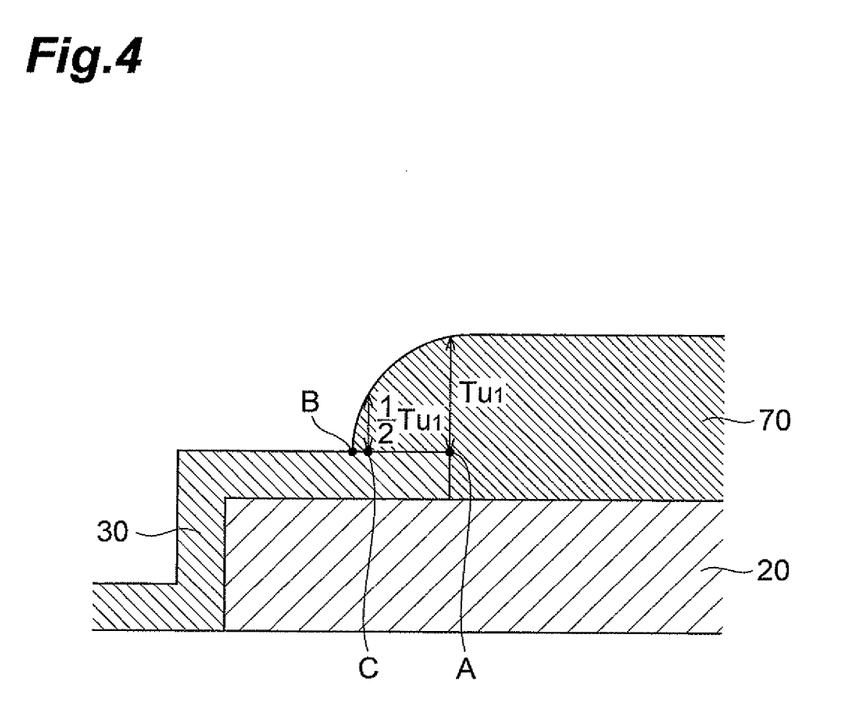
FIG. 4 is an enlarged sectional view schematically illustrating the terminal structure according to the present embodiment.

In the present embodiment, the corner of the end portion of the upper surface of the UBM layer is rounded so that the IMC phase particularly near the end portion of the UBM layer grows with less residual internal stress. This is described with reference to FIG. 4. FIG. 4 is an enlarged sectional view schematically illustrating the terminal structure according to the present embodiment, in which one end portion of the terminal structure is enlarged. Here, assuming that on an upper surface of the insulating coating layer on the external electrode, point A is defined as a position of an end portion on an opening side of the insulating coating layer and point B is defined as a position of an end portion of the UBM layer covering part of the insulating coating layer; and on a basis of an upper surface of the insulating coating layer on the external electrode, point C is defined as a position where the thickness of the UBM layer covering the insulating coating layer is half the thickness of the UBM layer at the point A (an end portion of the opening); and distance AB is defined as a distance between the point A and the point B, distance BC is defined as a distance between the point B and the point C, and ratio R is defined as a ratio between AB and BC, R is preferable to satisfy the following expression:

$$R=BC/AB \geq 0.05.$$

Here, depending on the thickness, the diameter, and the like of other configurations, in view of the terminal structure design, R is preferable to be 0.50 or less.

If on a basis of an upper surface of the insulating coating layer on the external electrode, there is a plurality of positions where the thickness of the UBM layer covering the insulating coating layer is half the thickness of the UBM layer at point A (an end portion of the opening), a point closest to the end portion (point B) of the UBM layer covering the insulating coating layer can be regarded as point C. Note that a position where the thickness of the UBM layer covering the insulating coating layer is half the thickness of the UBM layer at point A (an end portion of the opening) is preferable to be a single point.

The height, the spacing, and the like can be measured by observing the cross section along a lamination direction of the terminal structure by means of a scanning electron microscope (SEM) or the like.

Thus, as illustrated in FIG. 2(d), there can be manufactured a terminal structure comprising the base material 10; the external electrode 20 formed on the base material; the insulating coating layer 30 formed on the base material and on the external electrode and having an opening exposing at least part of the external electrode; the UBM layer 70 filling the opening and covering part of the insulating coating layer; and a dome-shaped bump 85 covering the UBM layer (and part of the insulating coating layer), wherein in a cross section along a lamination direction, the UBM layer has a convex shape toward the bump, and the thickness $T_{u0}$ of the UBM layer at a center of the opening is equal to or greater than the thickness $T_{u1}$ of the UBM layer at an end portion of the opening.

The present inventors consider that such a terminal structure can be implemented by obtaining a precursor substrate by reduction-type electroless tin plating. Specifically, the precursor substrate for obtaining the terminal structure of the present embodiment eliminates the need of a seed layer for electrolytic solder plating, and thus as illustrated in FIG. 2(b), the UBM layer is formed only on the external electrode exposed in the opening without the seed layer therebetween. For this reason, in an initial process of forming the UBM layer, a step of the insulating coating layer in the opening is filled in the UBM layer; subsequently, in a further process of forming the UBM layer, the UBM layer is formed on the insulating coating layer; and as a result, the UBM layer has a convex shape toward the tin bump. In contrast to this, in a case of the precursor substrate due to the conventional technique, as illustrated in FIG. 1(b), the UBM layer is formed with the seed layer 40 therebetween for electrolytic solder plating. For this reason, the UBM layer is formed similarly on the external electrode exposed in the opening and on the insulating coating layer, and as a result, the UBM layer has a shape following a stepped shape (concave shape) of the insulating coating layer in the opening. Thus, the conventional technique cannot obtain such a terminal structure as in the present embodiment.

Note that when the UBM layer is formed by electroless nickel plating in FIG. 2(b), a dry film may be formed to define a plating area.

Figure 3:
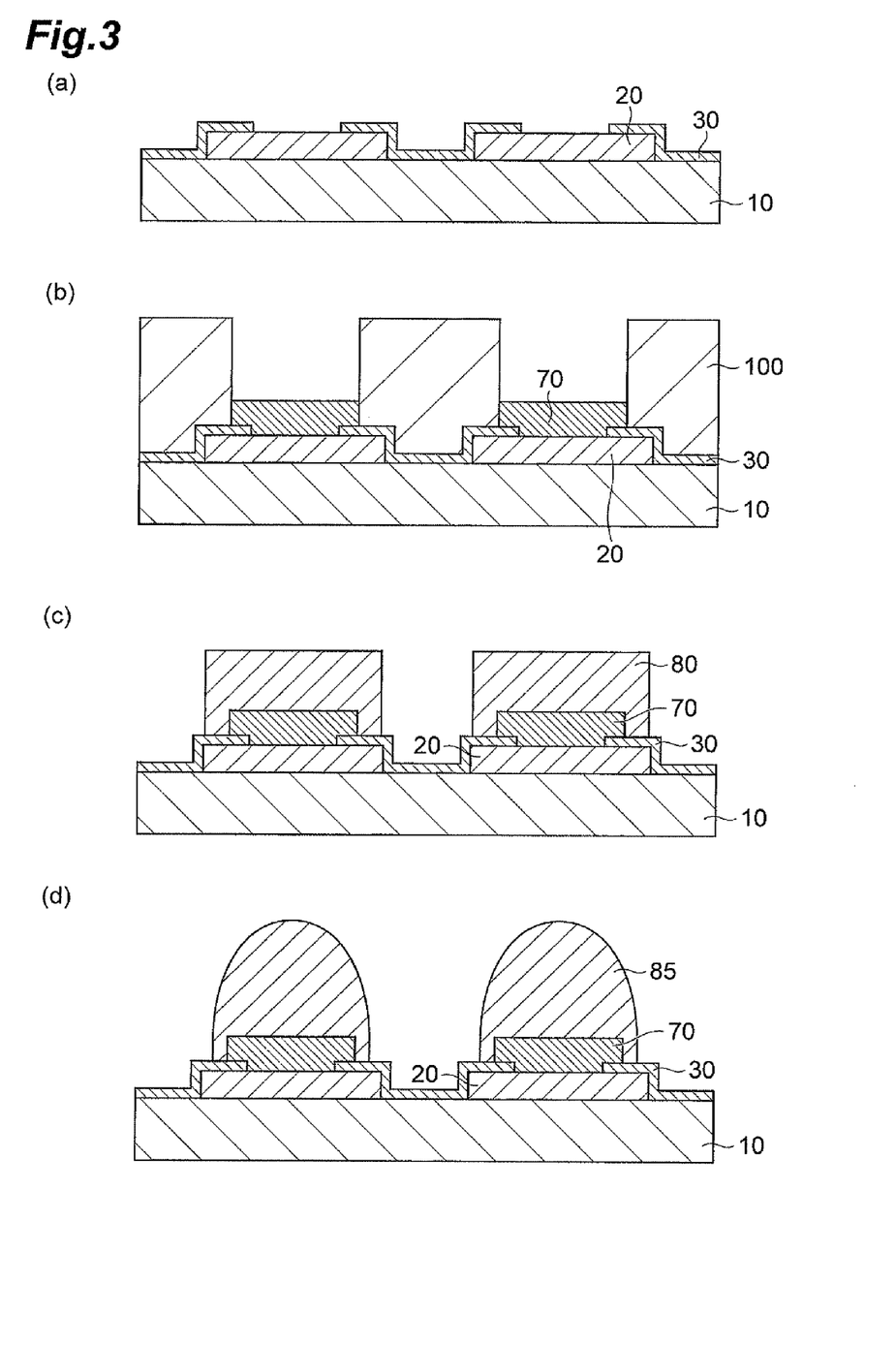
FIGS. 3(a)-(d) are sectional views schematically illustrating a preferred process of forming a terminal structure according to the present embodiment.

Specifically, as illustrated in FIG. 3(a), in the same manner as described in FIG. 2(a), a well-known method is used to individually form an external electrode 20 on a base material 10 and an insulating coating layer 30 having an opening on the external electrode.

Then, as illustrated in FIG. 3(b), a dry film 100 is formed on the external electrode surface exposed in the insulating coating layer opening and on the insulating coating layer surface. Subsequently, a well-known technique such as photoresist is used to pattern the dry film to thereby remove the dry film around the insulating coating layer opening. Then, electroless nickel plating is performed on the external electrode surface exposed in the insulating coating layer opening and part of the insulating coating layer surface to form a UBM layer 70.

Further, as illustrated in FIG. 3(c), a well-known technique is used to strip the dry film. Then, in the same manner as described in FIG. 2(c), reduction-type electroless tin plating is performed to form a tin plating layer 80. This makes it possible to obtain a precursor substrate for obtaining a desired terminal structure.

Subsequently, in the same manner as described above, the precursor substrate is subjected to a high-temperature process (reflow), which can obtain a terminal structure as illustrated in FIG. 3(d).

[Electroless Nickel Plating]

A plating solution containing a nickel salt, a complexing agent, a reducing agent, and the like can be used for electroless nickel plating. From the point of view of having good workability (bath stability and deposition rate) for electroless nickel plating, a plating solution containing a hypophosphorous acid as the reducing agent is preferable to be used.

Note that the UBM layer formed by electroless nickel plating contains nickel as a main component, but preferably contains Ni and P as constituent elements. From the point of view of obtaining flexibility and low stress of the UBM layer, the UBM layer more preferably contains 5 to 15 mass % of P. Note also that the UBM layer may contain not only Ni and P but also S or the like.

[Reduction-Type Electroless Tin Plating]

A plating solution containing a tin compound, an organic complexing agent, and an organic sulfur compound, an antioxidant, and a trivalent titanium compound as a reducing agent is preferably used for reduction-type electroless tin plating. Tin can be stably deposited on the UBM layer by appropriately selecting the kind and concentration of these constituent components. There follows a detailed description, but the kind, concentration, and mechanism thereof are not limited to the description.

The tin compound is not particularly limited as long as it serves as a source of tin, but is preferably one or two or more kinds selected from the group consisting of an inorganic acid salt of tin, a carboxylic acid salt of tin, an alkane sulfonic acid salt of tin, an alkanol sulfonic acid salt of tin, and a hydroxide of tin, as well as metastannic acid. These water-soluble tin compounds can be used as a mixture of one or two or more kinds of compounds.

Note that valence (oxidation number) of tin as the tin compound may be either divalent or tetravalent, but is preferably divalent from the point of view of having good deposition rate. That is, the stannous compound is preferred.

The content of the tin compound in the reduction-type electroless tin plating solution is not particularly limited, but is preferably 0.5 g/L to 100 g/L, more preferably 5 g/L to 30 g/L, and further more preferably 7 g/L to 15 g/L as metallic tin for the entire reduction-type electroless tin plating solution. If the content of the metallic tin in the reduction-type electroless tin plating solution is equal to or greater than 0.5 g/L, the deposition rate of tin coating can be sped up at a practical level. If the content of the metallic tin in the reduction-type electroless tin plating solution is equal to or less than 100 g/L, the tin compound as a tin source can be easily dissolved.

Although not particularly limited as the organic complexing agent, a phosphonic acid compound containing a trivalent phosphorus with an oxidation number of 3 like an organic phosphonic acid compound is preferred, examples thereof including amino group-containing methylene phosphonic acids such as nitrilo trimethylene phosphonic acid, ethylene diamine tetra methylene phosphonic acid, diethylenetriamine pentamethylene phosphonic acid, hexamethylene diamine tetra methylene phosphonic acid, and hexamethylene triamine penta methylene phosphonic acid; hydroxyl group-containing phosphonic acids such as 1-hydroxyethylidene-1 and 1-diphosphonic acid; benzene phosphonic acids such as 3-methoxy benzene phosphonic acid; benzyl phosphonic acids such as 3-methyl benzyl phosphonic acid and 4-cyano-benzyl phosphonic acid; alkali metal salts thereof; alkaline earth metal salts thereof; and ammonium salts thereof. Among them, the hydroxyl group-containing phosphonic acids are more preferable. The organic complexing agent can be used as a mixture of one or two or more kinds of these compounds.

The content of the organic complexing agent in the reduction-type electroless tin plating solution is not particularly limited, but is preferably 1 g/L to 500 g/L, more preferably 10 g/L to 200 g/L, and further more preferably 50 g/L to 150 g/L for the entire reduction-type electroless tin plating solution. If the content of the organic complexing agent in the reduction-type electroless tin plating solution is equal to or greater than 1 g/L, the organic complexing agent has a sufficient complexation force, stabilizes the plating solution, and can sufficiently exert an effect as the complexing agent; and if the content is equal to or less than 500 g/L, the organic complexing agent is readily soluble in water. Note that there is no further increase in the effect as the complexing agent with a content of 500 g/L or more, which may be uneconomical in terms of cost.

The organic sulfur compound is preferable to be an organic sulfur compound selected from the group consisting of mercaptans and sulfides. The "mercaptans" refer to a compound having a mercapto group (—SH) in the molecule. The "sulfides" refer to a compound having a sulfide group (—S—) in the molecule, and examples of the group attached to S include an alkanoyl group such as an alkyl group, an aryl group, and an acetyl group (ethanoyl group). Also, the sulfides include a polysulfide having a plurality of "—S—" directly bonded such as a disulfide and a trisulfide. Note that both mercaptans and sulfides, in which lone pair on S atom is active, act as a catalyst for tin deposition on the UBM layer (on the Ni film), and thus can stably deposit tin on the UBM layer.

The content of the organic sulfur compound in the reduction-type electroless tin plating solution is not particularly limited, but is preferably 0.1 ppm to 100000 ppm, more preferably 1 ppm to 10000 ppm, and further more preferably 5 ppm to 1000 ppm for the entire reduction-type electroless tin plating solution. If the content of the organic sulfur compound in the reduction-type electroless tin plating solution is equal to or greater than 0.1 ppm, a sufficient deposition rate can be secured. Meanwhile, if the content is equal to or less than 100000 ppm, the organic sulfur compound is readily soluble in water, and thus a stable plating solution can be obtained.

The antioxidant is not particularly limited as long as the antioxidant can prevent the oxidation of tin with a valence (oxidation number) of two to tin with a valence of four, but specific examples thereof include a phosphoric acid containing compound (hypophosphorous acid compound and phosphorous acid compound), hydrazine derivative, catechol, hydroquinone, pyrogallol, and salts thereof. Among them, the phosphoric acid containing compound is preferable and the phosphorous acid compound is more preferable. These antioxidants can be used as a mixture of one or two or more kinds of these compounds. Note that the addition of the antioxidant can not only prevent the aforementioned tin oxidation but also suppress excessive oxidation of trivalent titanium to be described later. This makes it possible to obtain a more stable plating solution and stably deposit tin onto the UBM layer (Ni film).

The content of the antioxidant in the reduction-type electroless tin plating solution is not particularly limited, but is preferably 0.1 g/L to 100 g/L and more preferably 1 g/L to 80 g/L for the entire reduction-type electroless tin plating solution. If the content of the antioxidant in the reduction-type electroless tin plating solution is equal to or greater than 0.1 g/L, the effect of the antioxidant can be sufficiently secured; and if the content is equal to or less than 100 g/L, abnormal deposition of tin in the reduction-type electroless tin plating solution can be suppressed, leading to good bath stability and stable tin plating.

The titanium compound is not particularly limited as long as the titanium compound is water-soluble and acts as a reducing agent, but specifically, for example, from the point of view of plating performance, easy availability, and the like, titanium halide such as titanium trichloride, titanium triiodide, and titanium tribromide; and titanium sulfate are preferable. The titanium is preferable to have a valence (oxidation number) of three. The reason for this is that the divalent titanium compound is unstable and may be readily oxidized and changed into tetravalent; and the tetravalent titanium compound itself is not oxidized and thus may not supply electrons. These water-soluble titanium compounds can be used as a mixture of one or two or more kinds of these compounds. Among them, from the point of view of plating performance, easy availability, and the like, titanium trichloride is particularly preferred.

The content of the titanium compound in the reduction-type electroless tin plating solution is not particularly limited, but is preferably 0.01 g/L to 100 g/L, more preferably 0.1 g/L to 20 g/L, and further more preferably 1 g/L to 10 g/L, as a titanium metal for the entire reduction-type electroless tin plating solution. If the content of the water-soluble titanium compound in the reduction-type electroless tin plating solution is equal to or greater than 0.01 g/L, the deposition rate of tin coating can be increased to a practical speed; and if the content of the water-soluble titanium compound in the reduction-type electroless tin plating solution is equal to or less than 100 g/L, abnormal deposition of tin can be suppressed, leading to good bath stability and stable tin plating.

Note that the reduction-type electroless tin plating solution may not only contain these components but also appropriately contain a buffering agent for maintaining the plating solution at a constant pH, a surface-active agent for removing a pinhole of a tin plating film and providing good foam-breaking performance of the plating solution, and a brightening agent for more smoothing the tin plating coating.

The plating conditions for the reduction-type electroless tin plating solution are not particularly limited, but the temperature condition is preferably 40° C. to 90° C. and more preferably 50° C. to 80° C. Also, the plating time is preferably 30 seconds to 5 hours and more preferably 1 minute to 2 hours.

Note that the tin plating layer (bump) formed by reduction-type electroless tin plating contains Sn as a main component, but is preferable to contain Sn and Ti as constituent elements. In particular, if the tin plating layer contains Ti, the metal contained in the bump can be suppressed from being diffused into the UBM layer.

[Semiconductor Device]

Thus fabricated terminal structure can be suitably applied to semiconductor devices and the like. For example, if applied to a semiconductor device, a material in which a semiconductor circuit is formed on a surface or an inside of a silicon substrate or the like can be applied as the base material 10. In addition, an electrode electrically connected to the semiconductor circuit can be applied as the external electrode 20. Note that the surface of the silicon substrate or the like may include a trench or a step. In this case, the external electrode 20 may be formed in a portion having the aforementioned trench or step. Specifically, the external electrode 20 may be formed, for example, on a bottom surface (concave portion) of the trench, an upper surface (convex portion) of the step, a bottom surface (concave portion) of the step, or the like. Alternatively, the external electrode 20 may be formed on a surface substantially perpendicular to a main surface of the silicon substrate or the like. Specifically, the external electrode 20 may be formed, for example, on a side surface of the silicon substrate or the like, on a side surface of the trench or the step, or the like. Such a semiconductor device can increase the bump mechanical strength and reduce the spacing between adjacent bumps, which can sufficiently meet the need for miniaturization of semiconductor devices.

EXAMPLE

There follows a more detailed description of the content of the present invention using examples and comparative examples, but the present invention is not limited to the following examples.

Example 1

Forming Electrode and Insulating Coating Layer

There was prepared a silicon substrate (5×5 mm, 0.6 mm thick) on which an external electrode and a SiN insulating coating layer having an opening are formed as illustrated in FIG. 2(*a*). Note that the external electrode was made of copper and the 10×10 openings were arranged so as to be equally spaced from each other.

(Electroless Nickel Plating)

Then, predetermined pretreatments (degreasing, pickling, and activating treatments) were performed on a copper external electrode surface exposed in an opening of the SiN insulating coating layer, followed by electroless nickel plating, to form a UBM layer filling the opening and covering part of the SiN insulating coating layer (FIG. 2(*b*)). Note that as the electroless nickel plating, a well-known electroless nickel-phosphorus plating solution (phosphorus concentration of 10 mass % in the UBM layer) was used. In addition, as the plating conditions, the temperature was 85° C., and the time was adjusted so as to obtain a predetermined nickel plating layer thickness.

(Reduction-Type Electroless Tin Plating)

Further, reduction-type electroless tin plating was performed and there was obtained a precursor substrate on which a tin plating layer covering the UBM layer and part of the SiN insulating coating layer was formed so as to enclose the entire UBM layer formed as described above (FIG. 2(*c*)). Note that the compositions of the reduction-type electroless tin plating solution were as follows. In addition, as the plating conditions, the temperature was 60° C. and the time was adjusted so as to obtain a predetermined tin plating layer height.

Tin compound (stannous chloride): 10 g/L (as tin)

Phosphorus-containing organic complexing agent (hydroxyl group-containing phosphonic acid): 100 g/L Organic sulfur compound (sulfide group-containing organic sulfur compound): 100 ppm Antioxidant (phosphorous acid compound): 40 g/L Reducing agent (titanium trichloride): 5 g/L (as titanium)

(Reflow)

Thus obtained precursor substrate was held at 250° C. for 30 seconds in a nitrogen atmosphere (at an oxygen concentration of 500 ppm) to melt the tin plating layer, which was further subjected to rapid cooling to be solidified and there was obtained a silicon TEG (Test Element Group) substrate comprising a terminal structure having a dome-shaped tin bump as illustrated in FIG. 2(d). Note that the thickness, the pitch, and the like of each component were as illustrated in Table 1. Here, in Table, "rounded corner shape of UBM end" being "Yes" indicates that the corner of the end portion of the upper surface of the UBM layer is rounded.

Example 2

In the same manner as in example 1 except that a dry film was used to define a plating area when electroless nickel plating was performed, there was obtained a silicon TEG substrate comprising a terminal structure having a dome-shaped tin bump as illustrated in FIG. 3(d). Note that the thickness, the pitch, and the like of each component were as illustrated in Table 1. Note that in example 2, from the effect of the formed dry film, the corner of the end portion of the upper surface of the UBM layer had a substantially right angle, and thus "rounded corner shape of UBM end" was evaluated as "No".

Examples 3 to 7

In the same manner as in example 1 except that the thickness, the pitch, and the like of each component were changed as illustrated in Table 1, there was obtained a silicon TEG substrate comprising a terminal structure having a dome-shaped tin bump as illustrated in FIG. 2(d).

Example 8

In the same manner as in example 1 except that the external electrode was made of Al-0.5 mass % Cu alloy and predetermined pretreatments (degreasing, pickling, and zincate treatments) were performed on the external electrode surface, there was obtained a silicon TEG substrate comprising a terminal structure as illustrated in FIG. 2(d).

Example 9

In the same manner as in example 4 except that the external electrode was made of Al-0.5 mass % Cu alloy and predetermined pretreatments (degreasing, pickling, and zincate treatments) were performed on the external electrode surface, there was obtained a silicon TEG substrate comprising a terminal structure as illustrated in FIG. 2(d).

Comparative Example 1

There was obtained a terminal structure by performing electrolytic nickel plating instead of electroless nickel plating and further performing electrolytic tin plating instead of reduction-type electroless tin plating.

The terminal structure of comparative example 1 was fabricated as follows. First, a 0.1 μM thick copper layer was formed by sputtering on the copper external electrode surface exposed in the SiN insulating coating layer opening and the SiN insulating coating layer surface as a seed layer (FIG. 1(a)), and then a dry film was formed. Subsequently, the dry film was patterned by photoresist to remove the dry film around the SiN insulating coating layer opening. Then, electrolytic nickel plating was performed on the external electrode surface exposed in the SiN insulating coating layer opening and part (a seed layer surface not covered with the dry film) of the insulating coating layer surface to form the UBM layer. Note that well-known sulfamate bath was used as the electrolytic nickel plating. In addition, as the plating conditions, the temperature was 50° C., and the time and the plating current value were adjusted so as to obtain a predetermined nickel plating layer thickness.

Subsequently, electrolytic solder plating was continuously performed to form a solder plating layer on the UBM layer. At this time, the solder plating layer was formed only on the upper surface of the UBM layer, and the solder plating layer was not formed so as to cover part of the SiN insulating coating layer, that is to enclose the entire UBM layer (FIG. 1(b)). Note that a well-known alkanol sulfonic acid bath (Cu content of 0.5 mass %) was used as the electrolytic solder plating. In addition, as the plating conditions, the temperature was 50° C., and the time and the plating current value were adjusted so as to obtain a predetermined solder plating layer height.

Subsequently, the dry film was stripped and an unnecessary seed layer was removed (FIG. 1(c)); and under the same condition as in example 1, reflow was performed. Thus, there was obtained a terminal structure having such a shape as illustrated in FIG. 1(d). Note that the thickness, the pitch, and the like of each component were as illustrated in Table 2. Note that in this terminal structure, the maximum thickness $T_u$ of the UBM layer was a height of the convex portion located in both end portions of the UBM layer from the upper surface of the copper external electrode. Note also that opening end thickness $T_{u1}$ was a thickness (thickness of the convex portion located in both end portions) of the UBM layer in an end portion of the opening on the basis of the upper surface of the insulating coating layer on the external electrode; and opening center thickness $T_{u0}$ was a thickness of the UBM layer in a center portion of the opening on the basis of the same upper surface.

Comparative Example 2

In the same manner as in comparative example 1 except that electroless nickel plating was performed on the seed layer (copper layer) instead of electrolytic nickel plating, there was obtained a terminal structure having such a shape as illustrated in FIG. 1(d). Note that the thickness, the pitch, and the like of each component were as illustrated in Table 2.

Comparative Examples 3 to 5

In the same manner as in comparative example 1 there was obtained a terminal structure having such a shape as illustrated in FIG. 1(d). Note that only comparative example 5 failed to form a dry film, and thus failed to fabricate a terminal structure. Thus, the later described evaluation was not performed. Note that the thickness, the pitch, and the like of each component were as illustrated in Table 2.

TABLE 1

| | | EXAMPLES | | | | |
|---|---|---|---|---|---|---|
| | | 1 | 2 | 3 | 4 | 5 |
| | | EXTERNAL ELECTRODE | | | | |
| MATERIAL | | Cu | Cu | Cu | Cu | Cu |
| THICKNESS | | 2 μm | 2 μm | 2 μm | 2 μm | 2 μm |
| PITCH | $P_e$ | 100 μm | 100 μm | 40 μm | 40 μm | 40 μm |
| | | COATING LAYER | | | | |
| MATERIAL | | SiN | SiN | SiN | SiN | SiN |
| THICKNESS | | 1.0 μm | 1.0 μm | 1.0 μm | 1.0 μm | 1.0 μm |
| OPENING DIAMETER | $L_o$ | 20 μm | 20 μm | 15 μm | 15 μm | 8 μm |
| OPENING SPACING | $P_o$ | 80 μm | 80 μm | 25 μm | 25 μm | 32 μm |
| | | UBM LAYER | | | | |
| PLATING METHOD | | ELECTROLESS | ELECTROLESS | ELECTROLESS | ELECTROLESS | ELECTROLESS |
| THICKNESS | $T_u$ | 3.0 μm | 3.0 μm | 3.0 μm | 3.0 μm | 3.0 μm |
| OPENING END THICKNESS | $T_{u1}$ | 2.0 μm | 2.0 μm | 2.0 μm | 2.0 μm | 2.0 μm |
| OPENING CENTER THICKNESS | $T_{u0}$ | 2.0 μm | 2.0 μm | 2.0 μm | 2.5 μm | 2.0 μm |
| UBM SPACING | $P_u$ | 76 μm | 70 μm | 21 μm | 21 μm | 28 μm |
| RATIO R BETWEEN BC AND AB | | 0.15 | 0.03 | 0.15 | 0.10 | 0.15 |
| ROUNDED CORNER SHAPE OF UBM END | | YES | NO | YES | YES | YES |
| | | SN PLATING LAYER | | | | |
| PLATING METHOD | | ELECTROLESS | ELECTROLESS | ELECTROLESS | ELECTROLESS | ELECTROLESS |
| HEIGHT | $H_{b0}$ | 30 μm | 50 μm | 8 μm | 8 μm | 8 μm |
| | | BUMP | | | | |
| HEIGHT | $H_b$ | 50 μm | 50 μm | 22 μm | 22 μm | 22 μm |

| | | EXAMPLES | | | |
|---|---|---|---|---|---|
| | | 6 | 7 | 8 | 9 |
| | | EXTERNAL ELECTRODE | | | |
| MATERIAL | | Cu | Cu | Al—0.5Cu | Al—0.5Cu |
| THICKNESS | | 2 μm | 2 μm | 2 μm | 2 μm |
| PITCH | $P_e$ | 40 μm | 30 μm | 100 μm | 40 μm |
| | | COATING LAYER | | | |
| MATERIAL | | SiN | SiN | SiN | SiN |
| THICKNESS | | 1.0 μm | 1.0 μm | 1.0 μm | 1.0 μm |
| OPENING DIAMETER | $L_o$ | 8 μm | 8 μm | 20 μm | 15 μm |
| OPENING SPACING | $P_o$ | 32 μm | 22 μm | 80 μm | 25 μm |
| | | UBM LAYER | | | |
| PLATING METHOD | | ELECTROLESS | ELECTROLESS | ELECTROLESS | ELECTROLESS |
| THICKNESS | $T_u$ | 3.0 μm | 1.5 μm | 3.0 μm | 3.0 μm |
| OPENING END THICKNESS | $T_{u1}$ | 2.0 μm | 0.5 μm | 2.0 μm | 2.0 μm |
| OPENING CENTER THICKNESS | $T_{u0}$ | 2.5 μm | 0.5 μm | 2.0 μm | 2.5 μm |
| UBM SPACING | $P_u$ | 28 μm | 21 μm | 76 μm | 21 μm |
| RATIO R BETWEEN BC AND AB | | 0.10 | 0.15 | 0.15 | 0.10 |
| ROUNDED CORNER SHAPE OF UBM END | | YES | YES | YES | YES |
| | | SN PLATING LAYER | | | |
| PLATING METHOD | | ELECTROLESS | ELECTROLESS | ELECTROLESS | ELECTROLESS |
| HEIGHT | $H_{b0}$ | 8 μm | 6 μm | 30 μm | 8 μm |
| | | BUMP | | | |
| HEIGHT | $H_b$ | 22 μm | 17 μm | 50 μm | 22 μm |

TABLE 2

| | | COMPARATIVE EXAMPLES | | | | |
|---|---|---|---|---|---|---|
| | | 1 | 2 | 3 | 4 | 5 |
| EXTERNAL ELECTRODE | | | | | | |
| MATERIAL | | Cu | Cu | Cu | Cu | Cu |
| THICKNESS | | 2 μm | 2 μm | 2 μm | 2 μm | 2 μm |
| PITCH | $P_e$ | 100 μm | 100 μm | 40 μm | 40 μm | 30 μm |
| COATING LAYER | | | | | | |
| MATERIAL | | SiN | SiN | SiN | SiN | SiN |
| THICKNESS | | 1.0 μm | 1.0 μm | 1.0 μm | 1.0 μm | 1.0 μm |
| OPENING DIAMETER | $L_o$ | 20 μm | 20 μm | 15 μm | 8 μm | 8 μm |
| OPENING SPACING | $P_o$ | 80 μm | 80 μm | 25 μm | 32 μm | 22 μm |
| UBM LAYER | | | | | | |
| PLATING METHOD | | ELECTROLYTIC | ELECTROLESS | ELECTROLYTIC | ELECTROLYTIC | ELECTROLYTIC |
| THICKNESS | $T_u$ | 3.0 μm | 3.0 μm | 3.0 μm | 3.0 μm | — |
| OPENING END THICKNESS | $T_{u1}$ | 3.0 μm | 3.0 μm | 3.0 μm | 3.0 μm | — |
| OPENING CENTER THICKNESS | $T_{u0}$ | 2.0 μm | 2.0 μm | 2.0 μm | 2.0 μm | — |
| UBM SPACING | $P_u$ | 70 μm | 70 μm | 19 μm | 26 μm | — |
| RATIO R BETWEEN BC AND AB | | 0.03 | 0.03 | 0.03 | 0.03 | — |
| ROUNDED CORNER SHAPE OF UBM END | | NO | NO | NO | NO | — |
| SOLDER PLATING LAYER | | | | | | |
| PLATING METHOD | | ELECTROLYTIC | ELECTROLYTIC | ELECTROLYTIC | ELECTROLYTIC | — |
| HEIGHT | $H_{b0}$ | 50 μm | 50 μm | 20 μm | 20 μm | — |
| BUMP | | | | | | |
| HEIGHT | $H_b$ | 50 μm | 50 μm | — | 20 μm | — |

(Bump Formation Evaluation)

A bump formation evaluation was performed on the terminal structures obtained in the examples and the comparative examples in the following manner. Specifically, there were prepared a total of 100 (10×10) bumps and an optical microscope was used to confirm whether adjacent bumps were formed independently from each other or not. Evaluation A was that adjacent bumps were formed independently from each other without shorting; and evaluation B was that at least a pair of adjacent bumps were shorted to each other. The evaluation results were shown in Tables 3 and 4. Note that shorting was confirmed in comparative example 3 and thus the bumps shown in Table 2 were not measured.

(Bump Strength Evaluation)

A bump strength evaluation was performed on the terminal structures obtained in the examples and the comparative examples in the following manner. Specifically, there were fabricated bump strength test samples by bonding (10×10) bumps of a pair of two silicon TEG substrates face to face by means of a flip-chip mounter. Then, stud pins were bonded to a rear surface of the silicon substrate for the bump strength test sample and a fracture mode (break position) of the terminal structure was evaluated when pulled by means of a tensile tester so as to peel off the silicon substrate. Evaluation A was that a fracture mode only inside the bump was observed; and evaluation B was that a fracture mode in an interface between the UBM layer and the bump assumed as a failure mode was confirmed. The evaluation results were shown in Tables 3 and 4. Note that the bump strength evaluation was not performed for comparative example 3 in which adjacent bumps were shorted to each other. Note that when the sectional structure of the terminal structure in examples of evaluation A was observed, there was an IMC phase at a boundary between the UBM layer and the bump in any of the examples and a plurality of protrusions due to the IMC phase radially growing from the boundary was observed.

TABLE 3

| | EXAMPLES | | | | | | | | |
|---|---|---|---|---|---|---|---|---|---|
| | 1 | 2 | 3 | 4 | 5 | 6 | 7 | 8 | 9 |
| BUMP FORMATION EVALUATION | A | A | A | A | A | A | A | A | A |
| BUMP STRENGTH EVALUATION | A | A | A | A | A | A | A | A | A |

TABLE 4

| | COMPARATIVE EXAMPLES | | | | |
|---|---|---|---|---|---|
| | 1 | 2 | 3 | 4 | 5 |
| BUMP FORMATION EVALUATION | A | A | B | A | — |
| BUMP STRENGTH EVALUATION | B | B | — | B | — |

As described above, the terminal structures of the examples showed extremely excellent results for the bump formation evaluation and the bump strength evaluation. Thus, the terminal structure of the present invention was confirmed to be able to achieve a suitable balance between bump mechanical strength improvement and bump pitch reduction.

REFERENCE SIGNS LIST

10 . . . base material; 20 . . . external electrode; 30 . . . coating layer; 40 . . . seed layer; 50, 70 . . . under-bump metal layer; 60 . . . solder plating layer, 80 . . . tin plating layer; 65, 85 . . . bump; 100 . . . dry film.

What is claimed is:

1. A terminal structure comprising:
    a base material;
    an electrode formed on the base material;
    an insulating coating layer formed on the base material and on the electrode and having an opening exposing at least part of the electrode;
    an under-bump metal layer filling the opening and covering part of the insulating coating layer; and
    a dome-shaped bump (i) covering the under-bump metal layer, (ii) being in direct contact with and covering part of the insulating coating layer, and (iii) continuously tapering inward from the insulating coating layer to a top of the dome-shaped bump, wherein:
    in a cross section along a lamination direction, the under-bump metal layer has a convex shape toward the dome-shaped bump, and a thickness of the under-bump metal layer at a center of the opening is equal to or greater than the thickness of the under-bump metal layer at an end portion of the opening; and
    a ratio R between distance AB from point A to point B and distance BC from point B to point C satisfies the following expression:

$R=0.50 \geq BC/AB \geq 0.05.$ (i) on an upper surface of the insulating coating layer, point A being a position of an end on the opening side of the insulating coating layer, (ii) point B being a position of an end of the under-bump metal layer, and (iii) on a basis of the upper surface of the insulating coating layer, point C being a position where the thickness of the under-bump metal layer is half the thickness of the under-bump metal layer at point A.

2. The terminal structure according to claim 1, wherein the dome-shaped bump contains tin as a main component.

3. The terminal structure according to claim 1, wherein the under-bump metal layer contains nickel as a main component.

4. The terminal structure according to claim 1, wherein the dome-shaped bump contains titanium.

5. A semiconductor device comprising the terminal structure according to claim 1.

6. The terminal structure according to claim 1, wherein the cross-sectional diameter of the dome-shaped bump is the greatest at the insulating coating layer.

7. The terminal structure according to claim 1, wherein in the cross section along the lamination direction, an upper surface of the under-bump metal layer includes curved portions and a substantially flat portion therebetween.

8. The terminal structure according to claim 3, wherein the under-bump metal layer contains phosphorous.

9. The terminal structure according to claim 8, wherein the under-bump metal layer contains 5 to 15 mass % of phosphorous.

* * * * *